(12) United States Patent
Fu et al.

(10) Patent No.: US 10,156,603 B1
(45) Date of Patent: Dec. 18, 2018

(54) APPARATUS FOR ADDING JITTERS TO THE EDGES OF A PULSE SEQUENCE

(71) Applicant: UNIVERSITY OF ELECTRONIC SCIENCE AND TECHNOLOGY OF CHINA, Chengdu, Sichuan (CN)

(72) Inventors: Zaiming Fu, Chengdu (CN); Hanglin Liu, Chengdu (CN); Jianguo Huang, Chengdu (CN); Yijiu Zhao, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 0 days.

(21) Appl. No.: 15/729,298

(22) Filed: Oct. 10, 2017

(30) Foreign Application Priority Data

Jun. 14, 2017 (CN) .......................... 2017 1 0446127
Jun. 14, 2017 (CN) .......................... 2017 1 0446129
Jun. 14, 2017 (CN) .......................... 2017 1 0446135
Jun. 14, 2017 (CN) .......................... 2017 1 0446141

(51) Int. Cl.
*H03K 3/84* (2006.01)
*G01R 31/317* (2006.01)
*G01R 31/3193* (2006.01)
*G01R 31/30* (2006.01)
*H03K 5/156* (2006.01)

(52) U.S. Cl.
CPC ....... *G01R 31/31709* (2013.01); *G01R 31/30* (2013.01); *G01R 31/31937* (2013.01); *G01R 31/31715* (2013.01); *H03K 3/84* (2013.01); *H03K 5/156* (2013.01)

(58) Field of Classification Search
None
See application file for complete search history.

(56) References Cited

U.S. PATENT DOCUMENTS

| | | | |
|---|---|---|---|
| 7,138,829 B1 * | 11/2006 | Dalvi | G01R 31/3016 326/41 |
| 7,808,291 B2 | 10/2010 | Nakamura et al. | |
| 7,849,370 B2 | 12/2010 | Moshe et al. | |
| 8,169,225 B2 | 5/2012 | Schuttert | |

* cited by examiner

*Primary Examiner* — Cassandra Cox
(74) *Attorney, Agent, or Firm* — Oliff PLC

(57) ABSTRACT

The present invention provides an apparatus for adding jitters to the edges of a pulse sequence, the pulse sequence which edges is needed to adding jitters to is sent to a first edge-pulse converter and a second edge-pulse converter respectively, and be converted into a rising edge pulse signal and a falling edge pulse signal. The rising edge pulse signal and the falling edge pulse signal are delayed by different fixed times, and for the edge pulse signal which is delayed shorter, it should be further delayed by a programmable delay circuit, thus the edge to which the jitter is added can be adjusted to a leading position or a lagging position according to a jitter data read out from a jitter data storage, so the synthesized pulse sequence with jitter-added edges can be used as test signal for jitter tolerance measurement.

2 Claims, 12 Drawing Sheets

APPARATUS FOR ADDING JITTERS TO THE EDGES OF A PULSE SEQUENCE

FIELD OF THE INVENTION

This application claims priority under the Paris Convention to Chinese Patent Application No. 201710446127.X, 201710446129.9, 201710446135.4 and 201710446141.X, Filed Jun. 14, 2017, the entirety of which is hereby incorporated by reference for all purposes as if fully set forth herein.

The present invention relates to the field of digital test, more particularly to an apparatus for adding jitters to the edges of a pulse sequence.

BACKGROUND OF THE INVENTION

Digital equipment develops continuously in context of the rapid development of electronic technology in recent years, and exhibits its uniqueness in fields of communication, navigation and so on. With the development of semiconductor devices, digital equipment is evolving towards integration and intelligence, and presents the features of high precision, high integration, versatility, human-machine interaction and programmability. Meanwhile, the development of semiconductor and integration has also promoted the innovation of digital technology, and the development of digital technology largely reflects the current level of electronics industry's development.

As a typical digital equipment, Pulse sequence generator has a great significance in the research of various fields. In traditional test field, especially for function test, noise tolerance test, signal jitter tolerance test of high-frequency circuit, high speed digital device and so on, the pulse signal with adjustable jitter frequency, variable jitter size and adjustable duty circle, which has rich frequencies is needed and sent to the system under test. Meanwhile, the testing signal with rich function modes is also needed to analyze and test the system under test to check its corresponding condition, running state and so on, or perform fault diagnosis.

In pulse sequence, jitter is a transient change's offset from its ideal position in short time. Jitter can be categorized into random jitter (RJ) and deterministic jitter (DJ). Moreover, the deterministic jitter can be further categorized into three types: period jitter (PJ), data-dependent jitter (DDJ) and duty-cycle dependent jitter (DCDJ).

The causes of random jitter are complex, and difficult to eliminate. Random jitter may be caused by device's internal thermal noise, crystal's random vibration, cosmic rays and so on. In addition, signal reflection, signal crosstalk, switching noise, power supply interference, EMI and so on will bring random jitters.

The clock system is a very critical part of the digital system, directly determines the success or failure of data transmission and reception, and is the aorta of the whole digital system. Therefore, the clock jitter has been a matter of great concern. The parameters regarding to the clock jitter is provided by chip's data sheet. As for the high-speed serial data, its transmission standards generally require that overall jitter, inherent jitter, random jitter etc. can't be too large under a specific bit error rate, such as $10^{-12}$. The most common methods used to quantify jitters are peak-to-peak jitter testing and root-mean-square jitter testing.

In a digital system, jitter will cause the system bit error rate (BER) to increase. In order to guarantee the performance of the digital system under the circumstance of jittering, the jitter should be limited to a certain range, which is called as jitter tolerance. Therefore, in order to measure the jitter tolerance of the digital system, it is necessary to simulate multi-type digital signal jitter or clock jitter for obtaining the maximum allowable range of jittering under the circumstance of guaranteeing the digital system's performance. However, the current methods used to quantify jitters is not suitable for the measurement of jitter tolerance, and as so far, there is no such test as adding jitters to the edges of a pulse sequence to measure the jitter tolerance.

SUMMARY OF THE INVENTION

The present invention aims to overcome the deficiencies of the prior art and provides an apparatus for adding jitters to the edges of a pulse sequence to generate a signal with periodic edge jittering, so that the jitter tolerance can be measured under the periodic edge jittering, which range is controllable.

To achieve these objectives, in accordance with the present invention, an apparatus for adding jitters to the edges of a pulse sequence is provided, comprising: a digital signal generator, a fan-out circuit, a first edge-pulse converter, a second edge-pulse converter, a first fixed-delay circuit, a second fixed-delay circuit, an address controller, a jitter data storage circuit, a programmable delay circuit, a phase shifter and a edge synthesis circuit, wherein:

the digital signal generator generates a pulse sequence, which edges is needed to adding jitters to, and sends the pulse sequence to the fan-out circuit;

the fan-out circuit drives the pulse sequence, and sends the pulse sequence to the first edge-pulse converter and the second edge-pulse converter simultaneously;

the first edge-pulse converter converts the pulse sequence into a rising edge pulse signal by turning each rising edge of the pulse sequence into a narrow-pulse, and sends the rising edge pulse signal to the first fixed-delay circuit; the second edge-pulse converter converts the pulse sequence into a falling edge pulse signal by turning each falling edge of the pulse sequence into a narrow-pulse, and sends the falling edge pulse signal to the second fixed-delay circuit;

the first fixed-delay circuit receives the rising edge pulse signal, and delays it a fixed delay time $T_1$, the second fixed-delay circuit receives the falling edge pulse signal, and delays it a fixed delay time $T_2$; where if jitters are added to the rising edges, the rising edge pulse signal is sent to the programmable delay circuit after the first fixed delay, the falling edge pulse signal is sent to the edge synthesis circuit after the second fixed delay, the fixed delay time $T_1$ is less than the fixed delay time $T_2$; if jitters are added to the falling edges, the falling edge pulse signal is sent to the programmable delay circuit after the second fixed delay, the rising edge pulse signal is sent to the edge synthesis circuit after the first fixed delay, the fixed delay time $T_1$ is greater than the fixed delay time $T_2$;

the address controller generates addresses under the control of a clock signal and a trigger signal, and sends the addresses to the jitter data storage in sequence;

the jitter data storage circuit read out jitter data according to the addresses generated by the address controller, and then sends the jitter data to the programmable delay circuit in sequence; where the jitter data are delay times;

the phase shifter shifts the phase of the clock signal, and sends the shifted clock signal to the programmable delay circuit as a loading control signal, which ensures that each jitter data arrives at the programmable delay circuit before the arrival of the shifted clock;

the programmable delay circuit loads the jitter data under the control of the loading control signal, thus the programmable delay time $T_3$ of the programmable delay circuit equals to the value of the loaded jitter data; when adding jitters to the rising edges, the programmable delay circuit will delay the rising edge pulse signal by programmable delay time $T_3$, and the fixed delay time $T_1$ plus programmable delay time $T_3$ is less or greater than the fixed delay time $T_2$, the rising edge pulse signal is sent to the edge synthesis circuit after the programmable delay; when adding jitters to the falling edges, the programmable delay circuit will delay the falling edge pulse signal by programmable delay time $T_3$, and the fixed delay time $T_2$ plus programmable delay time $T_3$ is less or greater than the fixed time $T_1$, the falling edge pulse signal is sent to the edge synthesis circuit after the programmable delay;

the edge synthesis circuit synthesizes a pulse sequence with jitter-added edges by converting the rising edges of the rising edge pulse signal and the falling edges of the falling edge pulse signal into rising edges and falling edges respectively in one signal.

The objectives of the present invention may be realized as follows:

In the present invention, i.e. an apparatus for adding jitters to the edges of a pulse sequence, the pulse sequence which edges is needed to adding jitters to is sent to a first edge-pulse converter and a second edge-pulse converter respectively, and be converted into a rising edge pulse signal and a falling edge pulse signal. The rising edge pulse signal and the falling edge pulse signal are delayed by different fixed times, and for the edge pulse signal which is delayed shorter, it should be further delayed by a programmable delay circuit, thus the edge to which the jitter is added can be adjusted to a leading position or a lagging position according to a jitter data read out from a jitter data storage, so the synthesized pulse sequence with jitter-added edges can be used as test signal for jitter tolerance measurement.

Meanwhile, the present invention has the following advantageous features:

(1). The programmable time jitters are added to the edges of a pulse sequence by only using programmable delay circuit and pulse synthesis technology;

(2). The jitters added to edges of a pulse sequence can be any type of jitters, including sinusoidal jitters, triangular jitters, Gaussian jitters and so on;

(3). The jitters can be added to the edges of a pulse sequence, which is generated before the adding, moreover, no external synchronizing clock is needed in the process of jitter adding. There is no special requirement for signal source, only the input of the pulse sequence of a signal source and the input of jitter data are needed, thus, the most prominent feature of the present invention is that no redesign is needed in signal resource;

(4). The edge jitter is converted into a time delay, thus the programmable delay circuit with high resolution can be used to realize the high precision control of the edges of a pulse sequence, the jitter resolution can be higher than 1 ps.

BRIEF DESCRIPTION OF THE DRAWING

The above and other objectives, features and advantages of the present invention will be more apparent from the following detailed description taken in conjunction with the accompanying drawings, in which.

DETAILED DESCRIPTION OF THE PREFERRED EMBODIMENT

Figure 1:
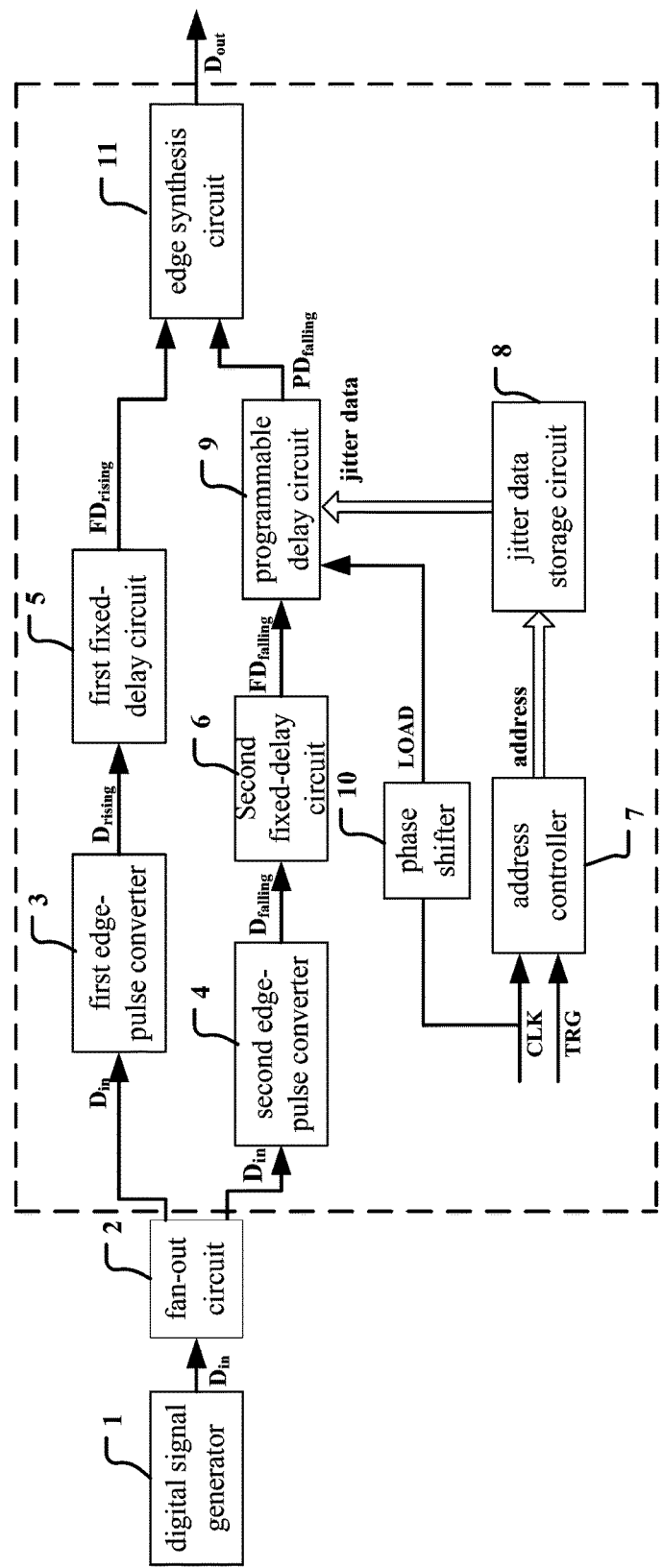
FIG. 1 is a diagram of an apparatus for adding jitters to the edges of a pulse sequence according to one embodiment of the present invention.

Hereinafter, preferred embodiments of the present invention will be described with reference to the accompanying drawings. It should be noted that the similar modules are designated by similar reference numerals although they are illustrated in different drawings. Also, in the following description, a detailed description of known functions and configurations incorporated herein will be omitted when it may obscure the subject matter of the present invention.

Embodiment 1

FIG. 1 is a diagram of an apparatus for adding jitters to the edges of a pulse sequence according to one embodiment of the present invention.

In one embodiment of the present invention, as shown in FIG. 1, the apparatus for adding jitters to the edges of a pulse sequence comprises: a digital signal generator 1, a fan-out circuit 2, a first edge-pulse converter 3, a second edge-pulse converter 4, a first fixed-delay circuit 5, a second fixed-delay circuit 6, an address controller 7, a jitter data storage circuit 8, a programmable delay circuit 9, a phase shifter 10 and a edge synthesis circuit 11.

The digital signal generator 1 generates a pulse sequence $D_{in}$, which edges is needed to adding jitters to, and sends the pulse sequence $D_{in}$ to the fan-out circuit 2.

The fan-out circuit 2 drives the pulse sequence $D_{in}$, and sends the pulse sequence $D_{in}$ to the first edge-pulse converter 3 and the second edge-pulse converter 4 simultaneously.

The first edge-pulse converter 3 converts the pulse sequence $D_{in}$ into a rising edge pulse signal $D_{rising}$ by turning each rising edge of the pulse sequence $D_{in}$ into a narrow-pulse, and sends the rising edge pulse signal to the first fixed-delay circuit 5; the second edge-pulse converter 6 converts the pulse sequence $D_{in}$ into a falling edge pulse signal $D_{falling}$ by turning each falling edge of the pulse sequence $D_{in}$ into a narrow-pulse.

the first fixed-delay circuit 5 receives the rising edge pulse signal $D_{rising}$, and delays it a fixed delay time $T_1$, the second fixed-delay circuit receives the falling edge pulse signal $D_{falling}$, and delays it a fixed delay time $T_2$. In the embodiment, jitters are added to the falling edges of the pulse sequence $D_{in}$, the falling edge pulse signal $FD_{falling}$ is sent to the programmable delay circuit 9 after the second fixed delay, i.e. delaying the fixed delay time $T_2$. The rising edge pulse signal $FD_{rising}$ is sent to the edge synthesis circuit 11 after the first fixed delay, i.e. delaying the fixed delay time $T_1$, the fixed delay time $T_1$ is greater than the fixed delay time $T_2$.

The address controller 7 generates addresses under the control of a clock signal CLK and a trigger signal TRG, and sends the addresses to the jitter data storage in sequence.

The jitter data storage circuit 8 read out jitter data according to the addresses generated by the address controller 7, and then sends the jitter data to the programmable delay circuit 9 in sequence; where the jitter data are delay times.

The phase shifter 10 shifts the phase of the clock signal CLK, and sends the shifted clock signal to the programmable delay circuit 9 as a loading control signal LOAD, which ensures that each jitter data arrives at the programmable delay circuit before the arrival of the shifted clock, i.e. the loading control signal LOAD.

The programmable delay circuit 9 loads the jitter data under the control of the loading control signal LOAD, thus the programmable delay time $T_3$ of the programmable delay circuit 9 equals to the value of the loaded jitter data. In the embodiment, jitters are adding to the falling edges, the programmable delay circuit 9 will delay the falling edge pulse signal $FD_{falling}$ by programmable delay time $T_3$, and the fixed delay time $T_2$ plus programmable delay time $T_3$ is less or greater than the fixed time $T_1$, the falling edge pulse signal $PD_{falling}$ is sent to the edge synthesis circuit 11 after the programmable delay.

The edge synthesis circuit 11 synthesizes a pulse sequence with jitter-added edges $D_{out}$ by converting the rising edges of the rising edge pulse signal $FD_{rising}$ and the falling edges of the falling edge pulse signal $PD_{falling}$ into rising edges and falling edges respectively in one signal.

Figure 2:
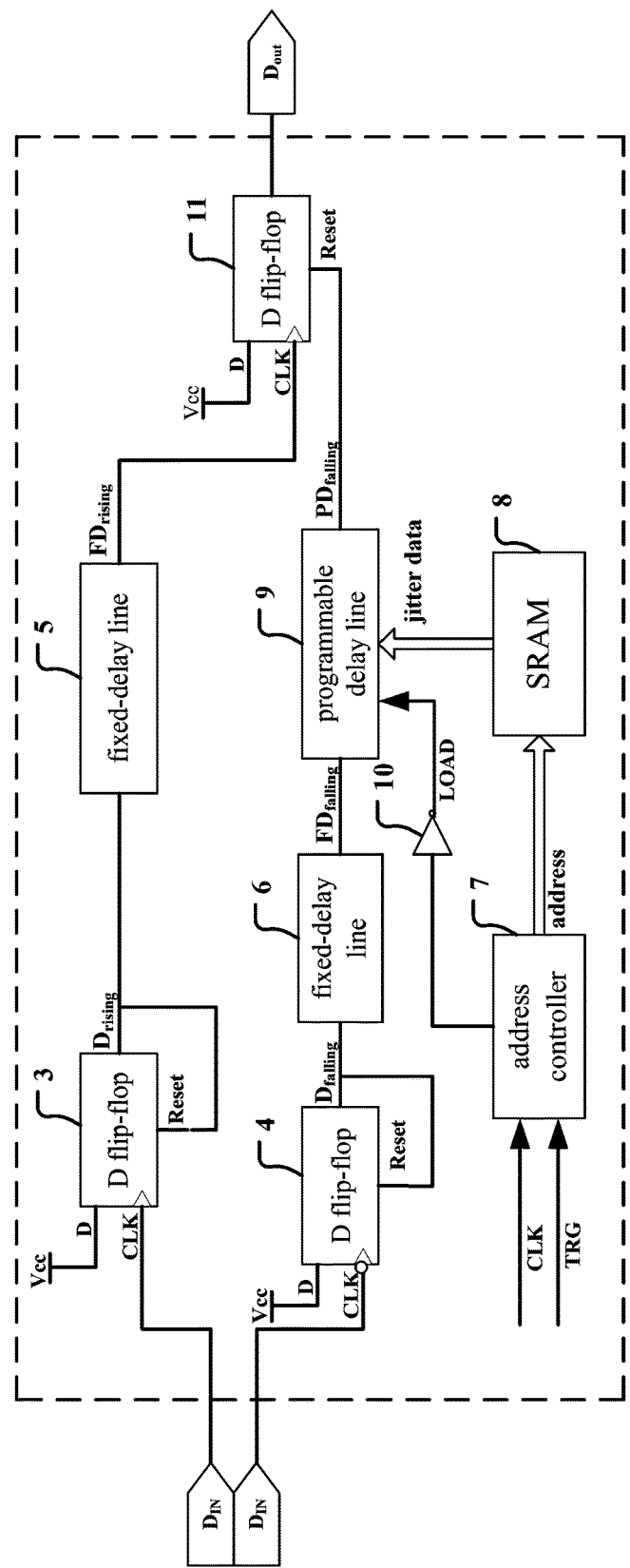
FIG. 2 is a schematic diagram of the virtual box, i.e. apparatus for adding jitters to edges of a pulse sequence, which is shown in FIG. 1.

FIG. 2 is a schematic diagram of the virtual box, i.e. apparatus for adding jitters to edges of a pulse sequence, which is shown in FIG. 1.

In the embodiment, as shown in FIG. 2, the an address controller 7 has time delay $T_4$, and the jitter data storage circuit 8 has time delay $T_5$. The time delay $T_4$ plus the time delay $T_5$ is less than $T/2$, i.e. half of the clock cycle $T$, therefore, a phase inverter is employed as the phase shifter 10 to realize 180° phase shift of the 50% duty cycle's clock signal CLK, thus, each jitter data arrives at the programmable delay circuit before the arrival of the shifted clock, i.e. the loading control signal LOAD, and the jitter data's loading is realized.

In the embodiment, a D flip-flop is employed as the first edge-pulse converter 3, the input D is connected to high level Vcc, the clock input CLK is connected to the pulse sequence $D_{in}$. When the rising edge of the clock input CLK, i.e. the pulse sequence $D_{in}$ arrives, the level of the output Q is turned from low level to high level, and is taken as a reset signal to reset the D flip-flop (the output Q is connected to the reset signal input Reset), the level of the output Q is turned from high level to low level, thus the output Q of the D flip-flop outputs the rising edge pulse signal $D_{rising}$ by turning each falling edge of the pulse sequence $D_{in}$ into a narrow-pulse.

In the embodiment, a D flip-flop is employed as the second edge-pulse converter 4, the input D is connected to high level Vcc, the clock input CLK is connected to the pulse sequence $D_{in}$. When the falling edge of the clock input CLK, i.e. the pulse sequence $D_{in}$ arrives, the level of the output Q is turned from low level to high level, and is taken as a reset signal to reset the D flip-flop (the output Q is connected to the reset signal input Reset), the level of the output Q is turned from high level to low level, thus the output Q of the D flip-flop outputs the falling edge pulse $D_{falling}$ signal by turning each falling edge of the pulse sequence $D_{in}$ into a narrow-pulse.

In the embodiment, a fixed-delay line with fixed delay time $T_1$ is employed as the first fixed-delay circuit 5, a fixed-delay line with fixed delay time $T_2$ is employed as the second fixed-delay circuit 6. A CNC (computerized numerical control) programmable delay line or an analog level control high precision programmable delay line is employed as the programmable delay circuit 9. The jitter data is converted into an analog level signal to control programmable delay time $T_3$ by a DAC, when the employing the analog level control high precision programmable delay line. A SRAM (Static Random Access Memory) is employed as the jitter data storage circuit 8.

In the embodiment, a D flip-flop is employed as edge synthesis circuit 11. the input D is connected to high level Vcc, the clock input CLK is connected to the rising edge pulse signal $FD_{rising}$, the reset signal input Reset is connected to the falling edge pulse signal $D_{falling}$. Thus, when the rising edge of the rising edge pulse signal $FD_{rising}$ arrives, the level of the output of the D flip-flop is turned to high level, and when the falling edge pulse of the falling edge pulse signal $D_{falling}$ arrives, the level of the output of the D flip-flop is turned to low level, then a pulse sequence with jitter-added falling edges $D_{out}$ is obtained.

Figure 3:
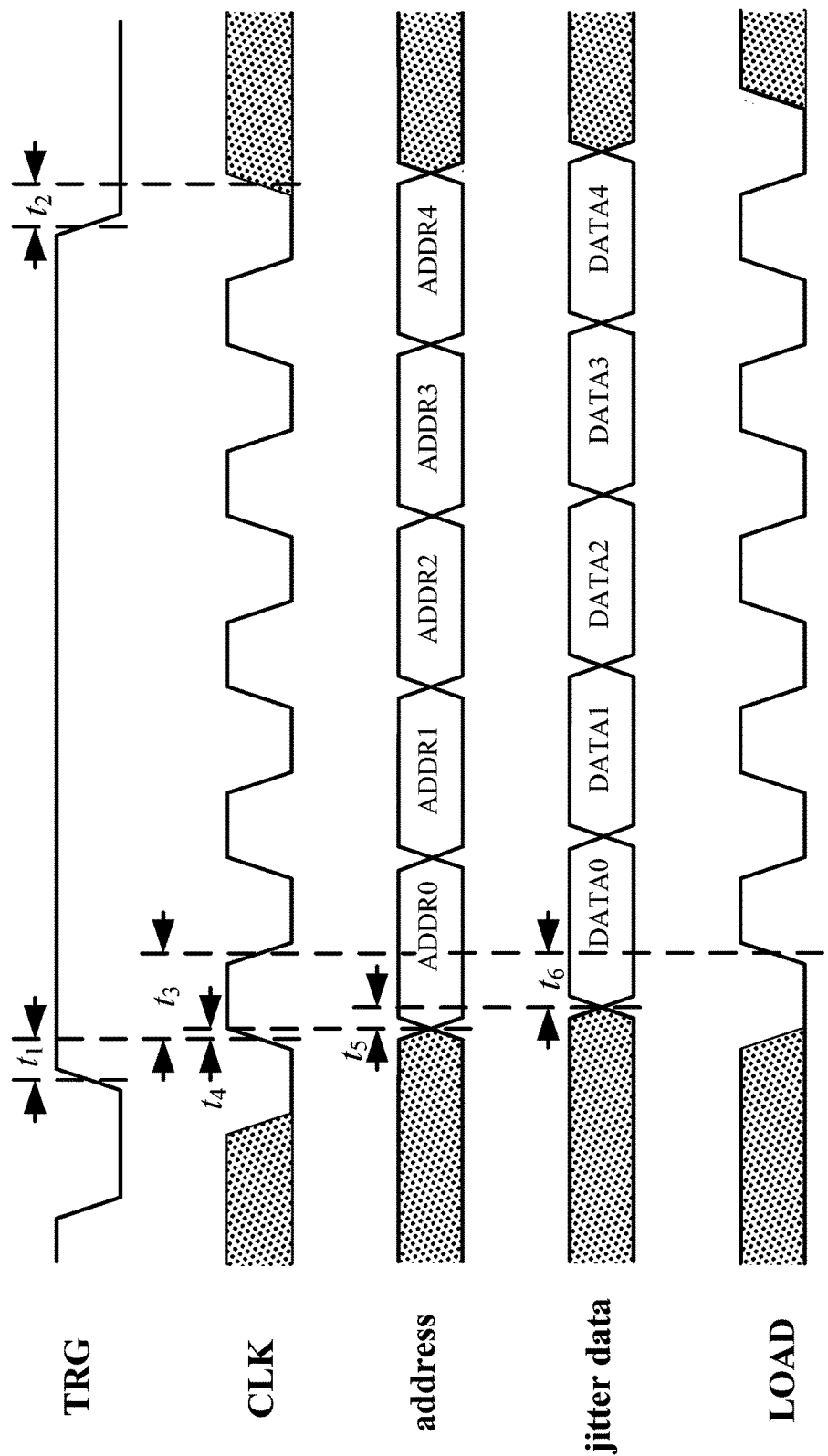
FIG. 3 is a sequence diagram of jitter data adding in the apparatus for adding jitters to edges of a pulse sequence which is shown in FIG. 2.

FIG. 3 is a sequence diagram of jitter data adding in the apparatus for adding jitters to edges of a pulse sequence which is shown in FIG. 2.

In the embodiment, as shown in FIG. 3, $t_1$ is the time interval from the rising edge of the trigger signal TRG to rising edge of the clock signal CLK, $t_2$ is the time interval from the falling edge of the trigger signal TRG to falling edge of the clock signal CLK, $t_3$ is the time interval from the rising edge of the clock signal CLK to rising edge of the loading control signal LOAD, $t_4$ is the time interval from the rising edge of the clock signal CLK to the generation time of the address, i.e. the time delay $T_4$. $t_5$ is the time interval from the generation time of the address to the generation time of the jitter data, the time delay $T_5$, $t_6$ is the time interval from the generation time of the jitter to rising edge of the loading control signal LOAD.

From the FIG. 3, we can see that comparing to the clock signal CLK, the loading control signal LOAD is delayed $t_3$, i.e. half of the clock cycle T, which ensures that the jitter data arrives at the programmable delay circuit before the arrival of the shifted clock, i.e. the loading control signal LOAD. The jitter data is read out from the jitter data storage circuit 8 according to the addresses generated by the address controller 7, and the process of adding jitter data is in the high level period of the trigger signal TRG.

Figure 4:
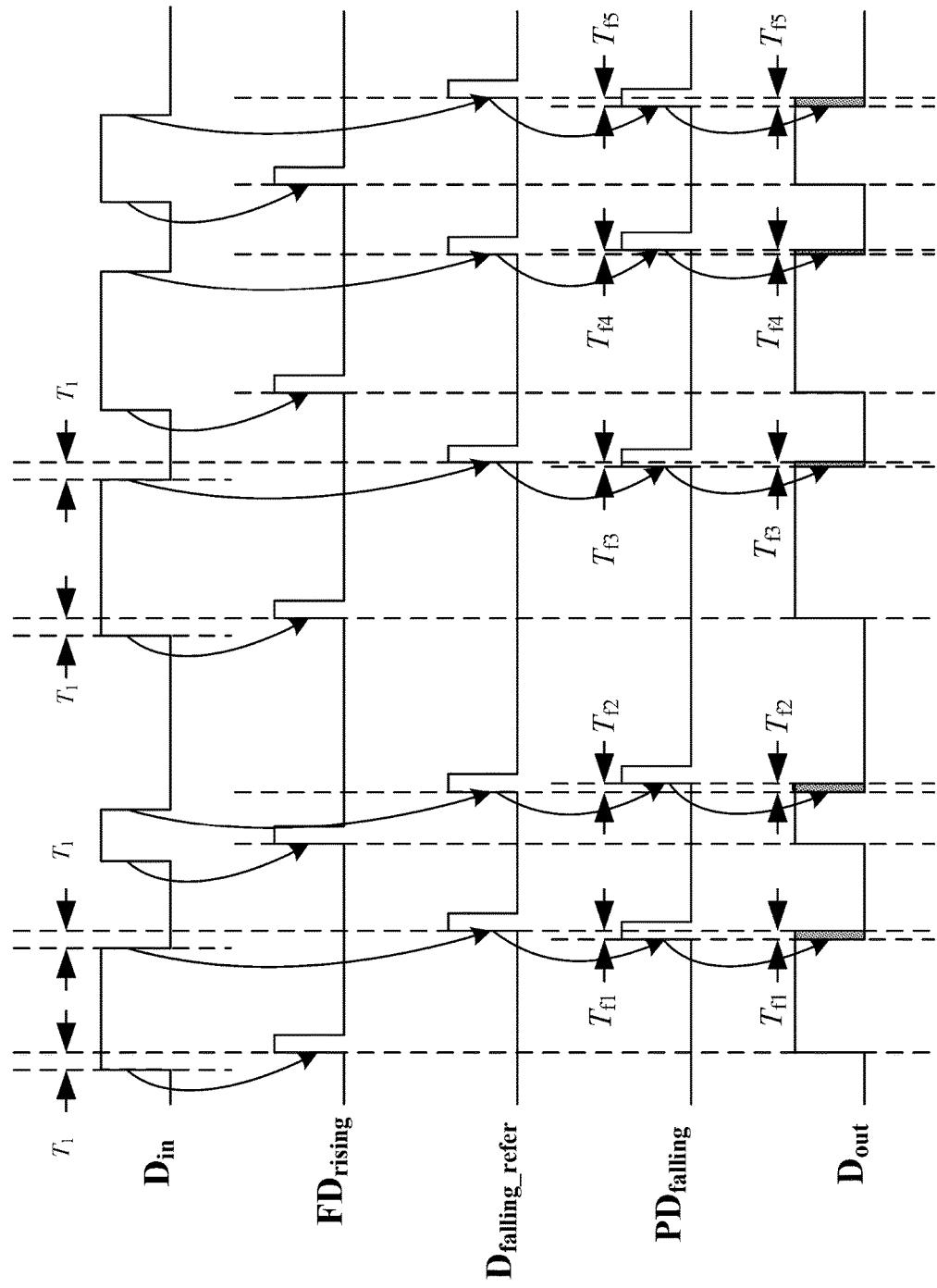
FIG. 4 is a waveform sequence diagram in the apparatus for adding jitters to edges of a pulse sequence which is shown in FIG. 2.

FIG. 4 is a waveform sequence diagram in the apparatus for adding jitters to edges of a pulse sequence which is shown in FIG. 2.

In the embodiment, as shown in FIG. 4, $D_{in}$ is a pulse sequence which edges is needed to adding jitters to, $FD_{rising}$ is the rising edge pulse signal obtained by the first fixed-delay circuit 5, $D_{falling\_ref}$ is the reference signal of the falling edge pulse signal $D_{falling}$, which is also delayed a fixed delay time $T_1$, i.e. the fixed delay time $T_2$ plus programmable delay time $T_3$ equals to the fixed time $T_1$, $PD_{falling}$ is the falling edge pulse signal obtained by the programmable delay circuit 9, $D_{out}$ is the pulse sequence with jitter-added falling edges. $T_1$ is the fixed delay time of the first fixed-delay circuit 5, $T_{f1}$, $T_{f3}$ and $T_{f5}$ are jitter times which are leading to the reference signal $D_{falling\_ref}$, $T_{f2}$ and $T_{f2}$ are jitter times which are lagging to the reference signal $D_{falling\_ref}$. From the FIG. 4, we can see that the jitters are added to the falling edges of a pulse sequence in the present invention.

Embodiment 2

Figure 5:
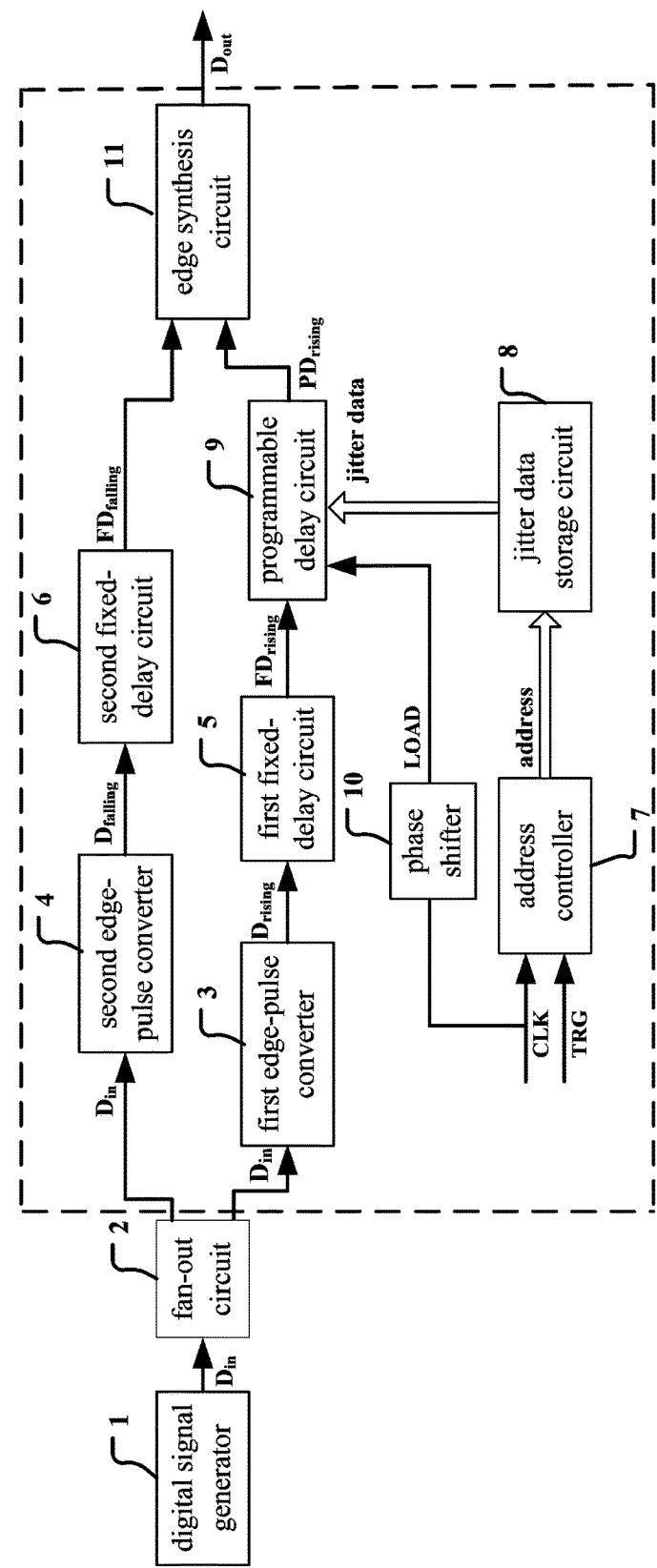
FIG. 5 is a diagram of an apparatus for adding jitters to the edges of a pulse sequence according to another embodiment of the present invention.

FIG. 5 is a diagram of an apparatus for adding jitters to the edges of a pulse sequence according to another embodiment of the present invention.

Figure 6:
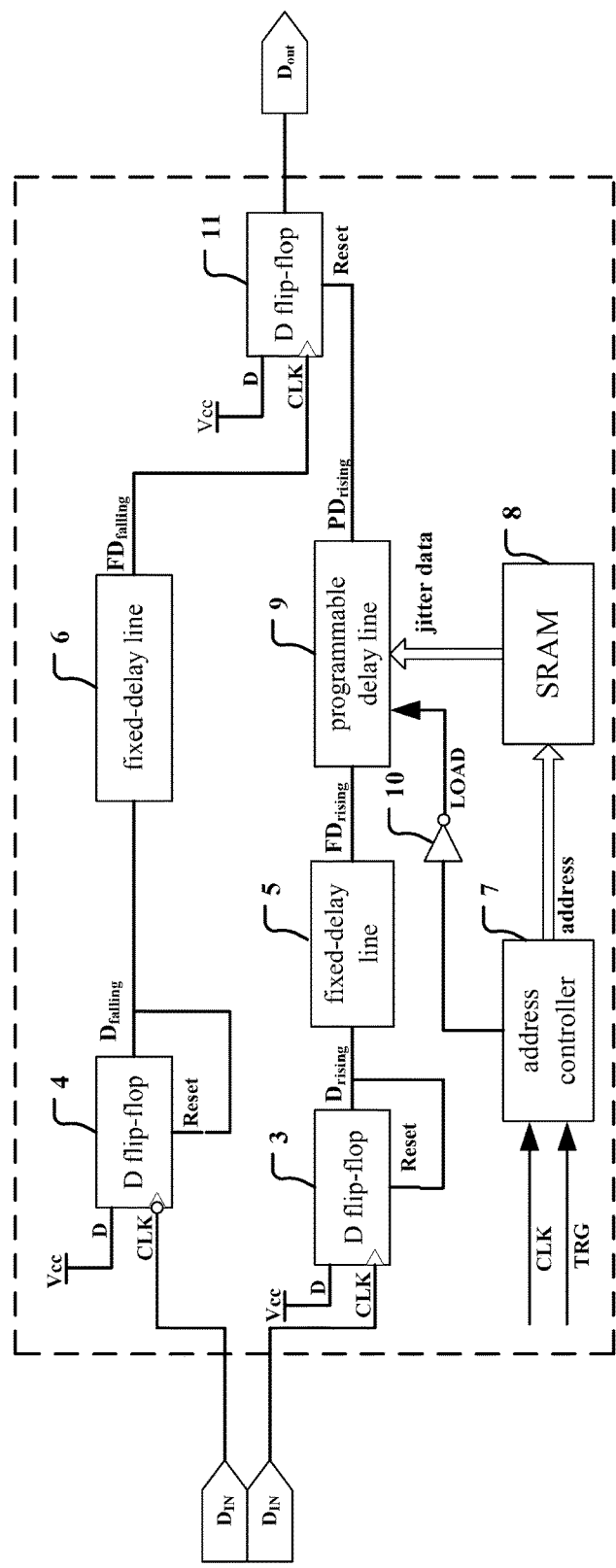
FIG. 6 is a schematic diagram of the virtual box, i.e. apparatus for adding jitters to edges of a pulse sequence, which is shown in FIG. 5.

In another embodiment of the present invention, as shown in FIG. 5. FIG. 6, except that jitters are added to the rising edges of the pulse sequence $D_{in}$, the apparatus for adding jitters to the edges of a pulse sequence is the same to the apparatus shown in FIG. 1.

In another embodiment, the rising edge pulse signal $FD_{rising}$ is sent to the programmable delay circuit 9 after the first fixed delay, i.e. delaying the fixed delay time $T_1$. The falling edge pulse signal $FD_{falling}$ is sent to the edge synthesis circuit 11 after the second fixed delay, i.e. delaying the fixed delay time $T_2$, the fixed delay time $T_2$ is greater than the fixed delay time $T_1$. The programmable delay circuit 9 will delay the rising edge pulse signal $FD_{rising}$ by programmable delay time $T_3$, and the fixed delay time $T_1$ plus programmable delay time $T_3$ is less or greater than the fixed time $T_2$, the rising edge pulse signal $PD_{rising}$ is sent to the edge synthesis circuit 11 after the programmable delay.

Figure 7:
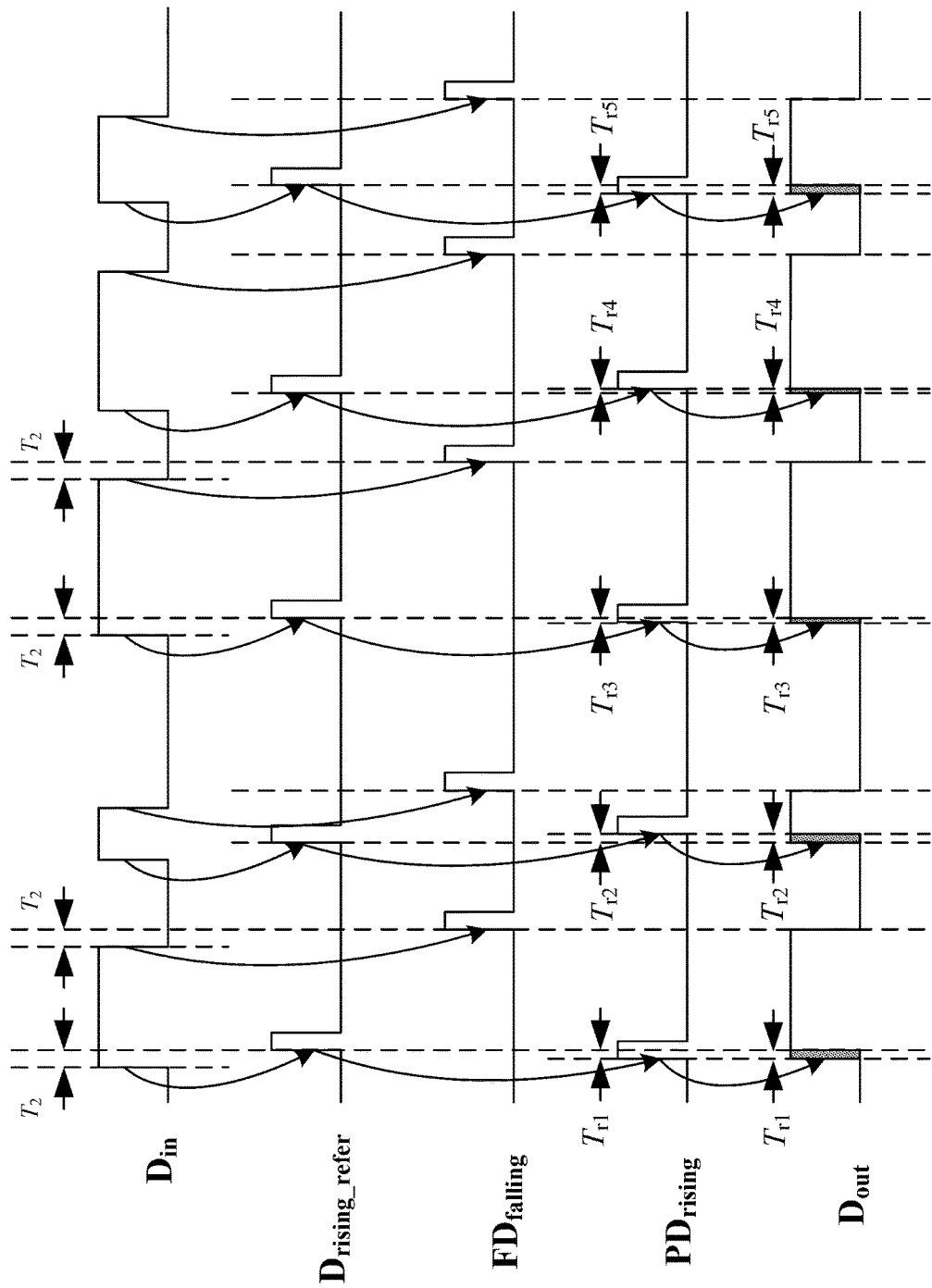
FIG. 7 is a waveform sequence diagram in the apparatus for adding jitters to edges of a pulse sequence which is shown in FIG. 5.

FIG. 7 is a waveform sequence diagram in the apparatus for adding jitters to edges of a pulse sequence which is shown in FIG. 5.

In another embodiment, as shown in FIG. 7, $D_{in}$ is a pulse sequence which edges is needed to adding jitters to, $FD_{falling}$ is the rising edge pulse signal obtained by the second fixed-delay circuit 6, $D_{rising\_ref}$ is the reference signal of the rising edge pulse signal $D_{rising}$, which is also delayed a fixed delay time $T_2$, i.e. the fixed delay time T plus programmable delay time $T_3$ equals to the fixed time $T_2$, $PD_{rising}$ is the rising edge pulse signal obtained by the programmable delay circuit 9, $D_{out}$ is the pulse sequence with jitter-added falling edges. $T_2$ is the fixed delay time of the second fixed-delay circuit 6, $T_{f1}$, $T_{f3}$ and $T_{f5}$ are jitter times which are leading to the reference signal $D_{rising\_ref}$, $T_{f2}$ and $T_{f2}$ are jitter times which are lagging to the reference signal $D_{rising\_ref}$. From the FIG. 7, we can see that the jitters are added to the rising edges of a pulse sequence in the present invention.

Embodiment 3

Figure 8:
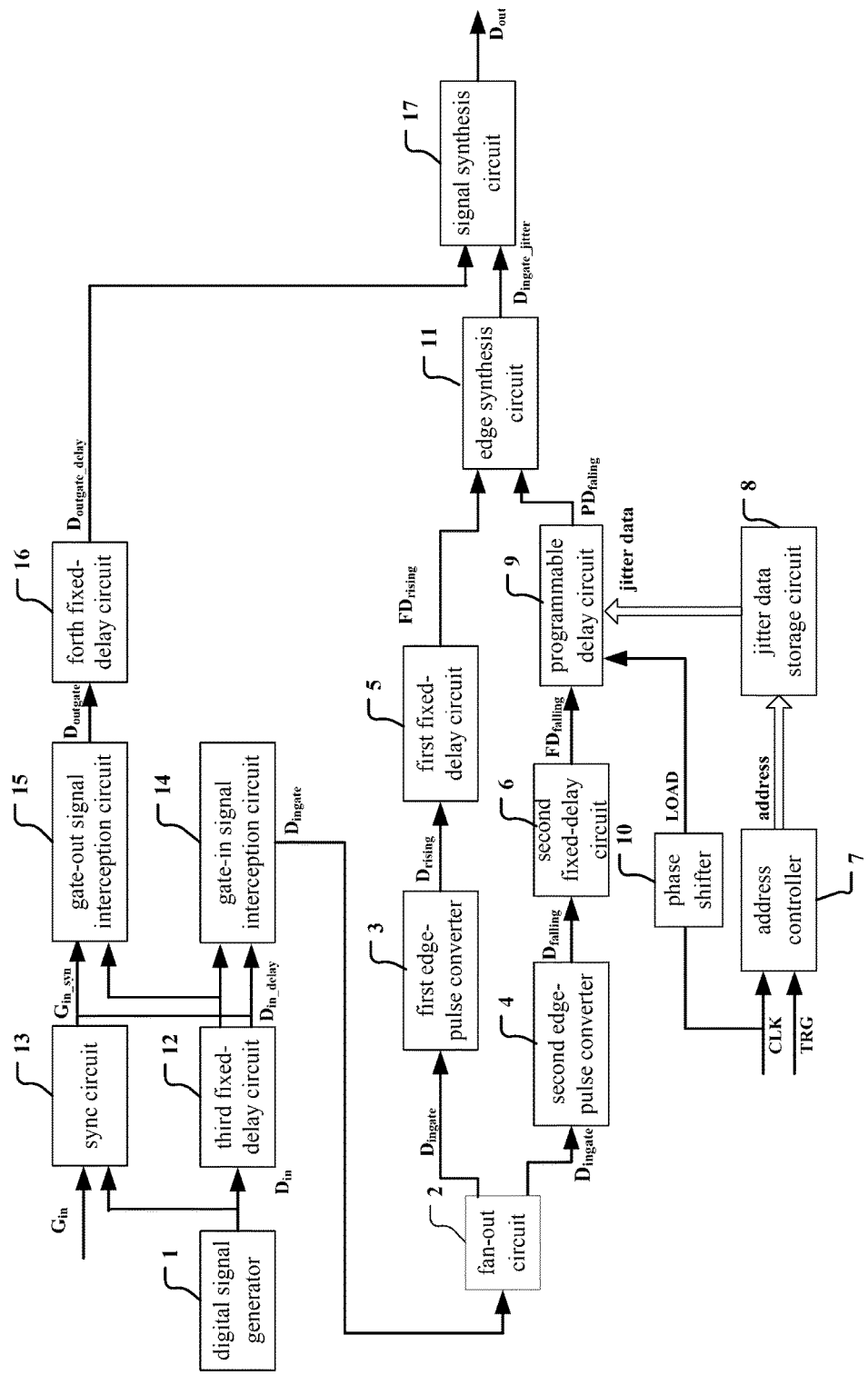
FIG. 8 is a apparatus for adding jitters to the edges of a pulse sequence according to another embodiment of the present invention.

In another embodiment of the present invention, as shown in FIG. 8, the apparatus for adding jitters to the edges of a pulse sequence further comprises a third fixed-delay circuit 12, a sync circuit 13, a gate-in signal interception circuit 14, a gate-out signal interception circuit 15, a forth fixed-delay circuit 16 and a signal synthesis circuit 17.

The digital signal generator 1 generates a pulse sequence $D_{in}$, which edges is needed to adding jitters to, and sends the pulse sequence $D_{in}$ to the third fixed-delay circuit 12 and sync circuit 13 simultaneously.

The sync circuit 13 receives a gate signal $G_{in}$, and synchronizes the gate signal $G_{in}$ with the pulse sequence $D_{in}$ to obtain a synchronized gate signal $G_{in\_syn}$.

The third fixed-delay circuit 12 delays the pulse sequence $D_{in}$ to obtain a delayed pulse sequence $D_{in\_delay}$, and the rising edge of the synchronized gate signal $G_{in\_syn}$ arrives before the rising edge's arrival of the delayed pulse sequence $D_{in\_delay}$.

The gate-in signal interception circuit 14 intercepts the delayed pulse sequence $D_{in\_delay}$, and takes out the signal which is in the gate of the synchronized gate signal $G_{in\_syn}$ as a gate-in signal $D_{ingate}$. The gate-in signal $D_{ingate}$ as pulse sequence $D_{in}$ in FIG. 1 is sent to the fan-out circuit 2, then a pulse sequence with jitter-added falling edges $D_{ingate\_jitter}$ (as $D_{out}$ in FIG. 1) is obtained by the edge synthesis circuit 11.

The gate-out signal interception circuit 15 intercepts the delayed pulse sequence $D_{in\_delay}$, and takes out the signal which is out of the gate of the synchronized gate signal $G_{in\_syn}$ as a gate-out signal $D_{outgate}$. The gate-out signal $D_{outgate}$ is delayed by the forth fixed-delay circuit 16, and the delayed gate-out signal $D_{outgate\_delay}$ is synchronized with the pulse sequence with jitter-added falling edges $D_{ingate\_jitter}$, i.e. they arrives at the signal synthesis circuit 17 at the same time.

The signal synthesis circuit 17 synthesizes a pulse sequence with part of jitter-added falling edges $D_{out}$ with the pulse sequence with jitter-added falling edges $D_{ingate\_jitter}$ and the delayed gate-out signal $D_{outgate\_delay}$.

Figure 9:
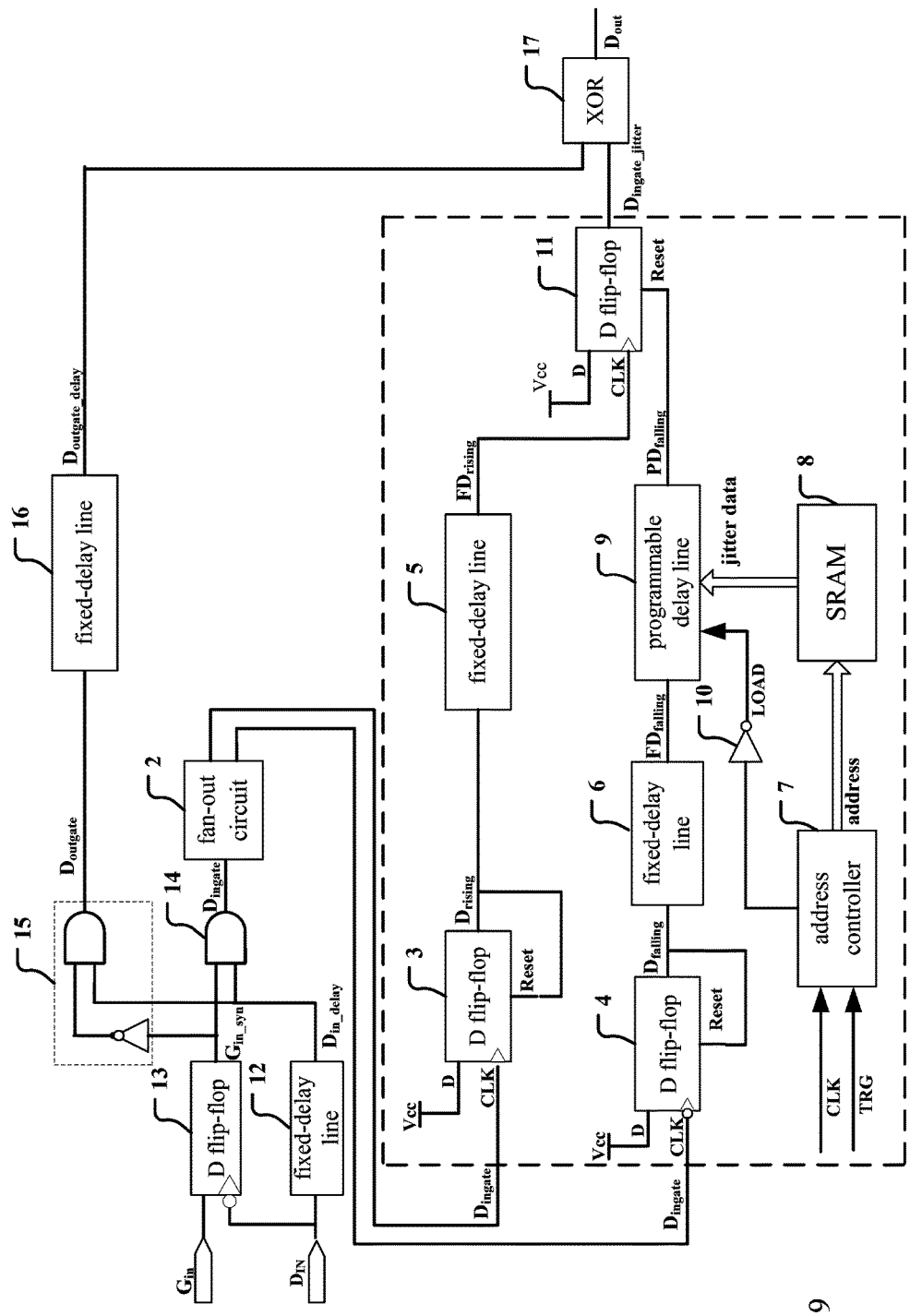
FIG. 9 is a schematic diagram of the apparatus for adding jitters to edges of a pulse sequence, which is shown in FIG. 8.

FIG. 9 is a schematic diagram of the apparatus for adding jitters to edges of a pulse sequence, which is shown in FIG. 8.

In another embodiment, as shown in FIG. 9, a D flip-flop is employed as the sync circuit 13, the input D is connected to a gate signal $G_{in}$, the clock input CLK is connected to the pulse sequence $D_{in}$, which edges is needed to adding jitters to. When the rising edge of the pulse sequence $D_{in}$ arrives and the level of the gate signal $G_{in}$ is at high level, the level of the output of the D flip-flop is turned to high level, thus the gate signal $G_{in}$ is synchronized with the pulse sequence $D_{in}$, and the output of the D flip-flop is the synchronized gate signal $G_{in\_syn}$.

Figure 10:
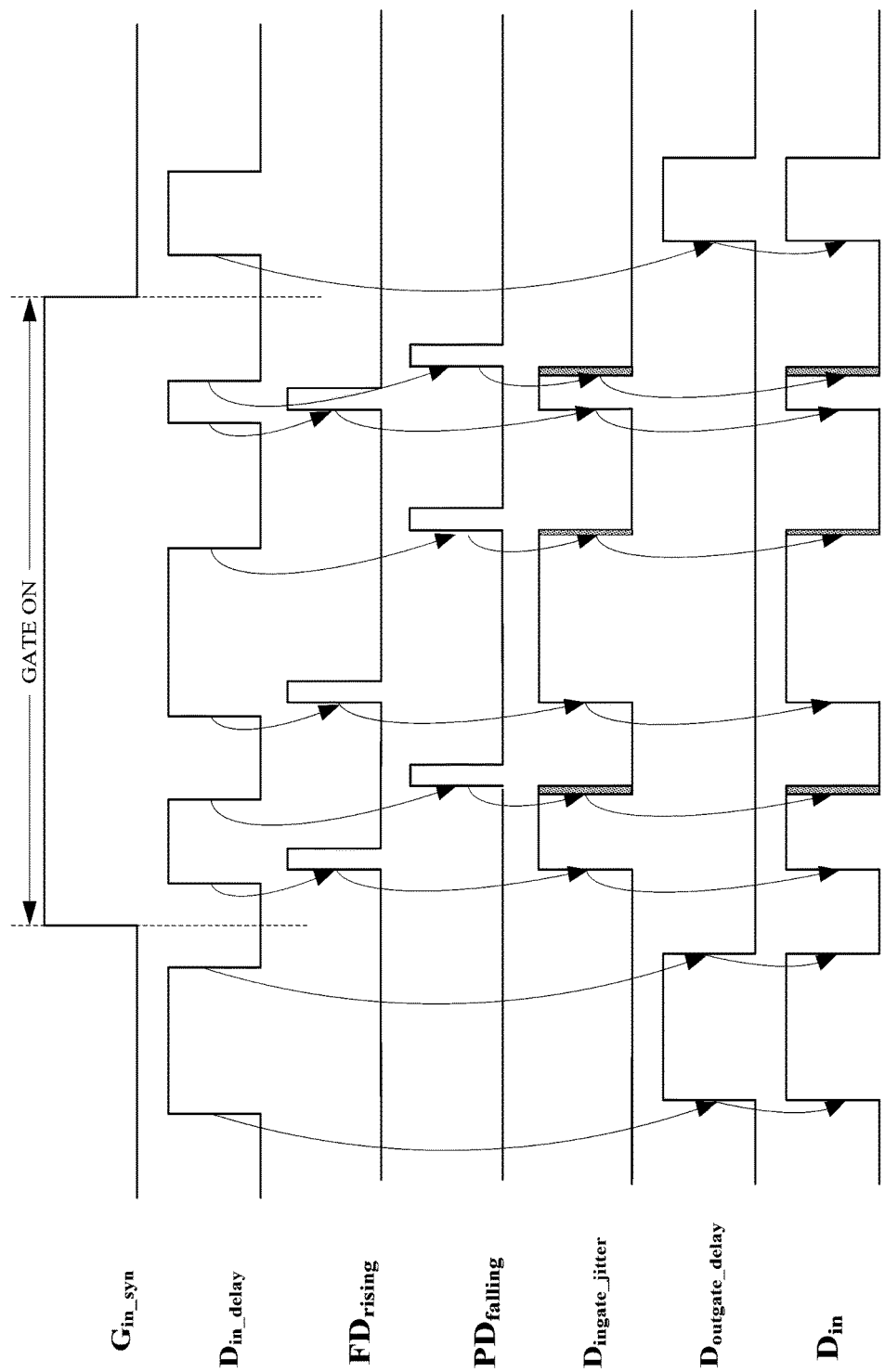
FIG. 10 is a waveform sequence diagram in the apparatus for adding jitters to edges of a pulse sequence which is shown in FIG. 9.

In another embodiment, as shown in FIG. 9, a fixed delay line is employed as the third fixed-delay circuit 12, and as shown in FIG. 10, the rising edge of the synchronized gate signal $G_{in\_syn}$ arrives before the rising edge's arrival of the delayed pulse sequence $D_{in\_delay}$.

In another embodiment, as shown in FIG. 9, a AND gate is employed as the gate-in signal interception circuit 14, only the signal of the delayed pulse sequence $D_{in\_delay}$ in the gate of the synchronized gate signal $G_{in\_syn}$, i.e. within the high level period of the synchronized gate signal $G_{in\_syn}$ can be output by the AND gate, thus the interception for the gate-in signal $D_{ingate}$ is accomplished.

In another embodiment, as shown in FIG. 9, a NOT gate and a AND gate are employed as the gate-out signal interception circuit 15, the synchronized gate signal $G_{in\_syn}$ is inverted by the NOT gate, thus only the signal of the delayed pulse sequence $D_{in\_delay}$ out of the gate of the synchronized gate signal $G_{in\_syn}$, i.e. out of the high level period of the synchronized gate signal $G_{in\_syn}$ can be output by the AND gate, thus the interception for the gate-out signal $D_{outgate}$ is accomplished.

In another embodiment, as shown in FIG. 9, a fixed-delay line is employed as the forth fixed-delay circuit 16, The gate-out signal $D_{outgate}$ is delayed by the forth fixed-delay circuit 16, so that the delayed gate-out signal $D_{outgate\_delay}$ is synchronized with the pulse sequence with jitter-added falling edges $D_{ingate\_jitter}$, i.e. they arrives at the signal synthesis circuit 17 at the same time.

In another embodiment, as shown in FIG. 9, a XOR gate is employed as the signal synthesis circuit 17. As shown in FIG. 10, when the level of the pulse sequence with jitter-added falling edges $D_{ingate\_jitter}$ and the level of the delayed gate-out signal $D_{outgate\_delay}$ are different from each other, the level of the output of the XOR gate is high level, thus the synthesis of the pulse sequence with part of jitter-added falling edges $D_{out}$ is accomplished.

Embodiment 4

Figure 11:
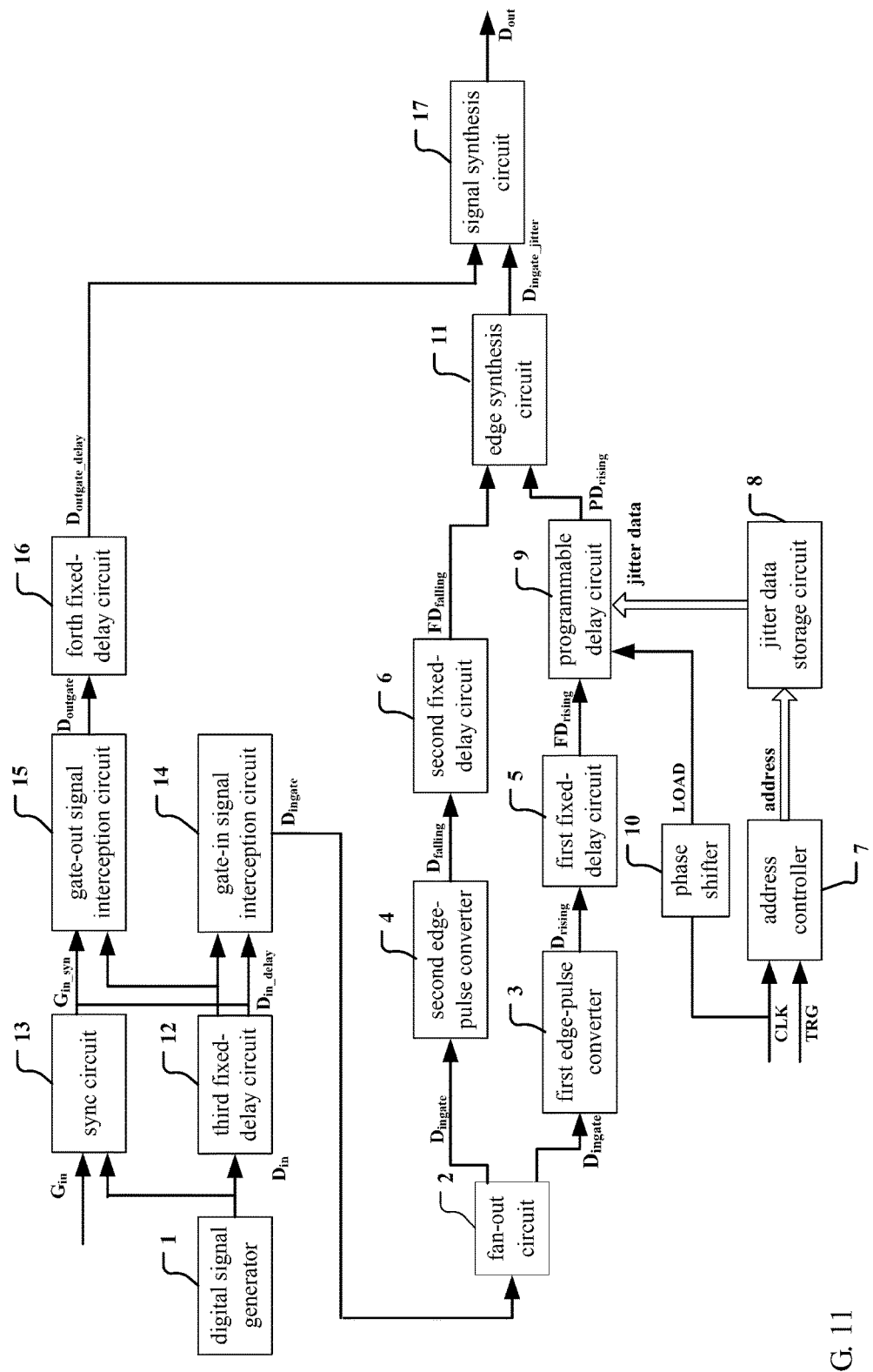
FIG. 11 is a apparatus for adding jitters to the edges of a pulse sequence according to another embodiment of the present invention.
Figure 12:
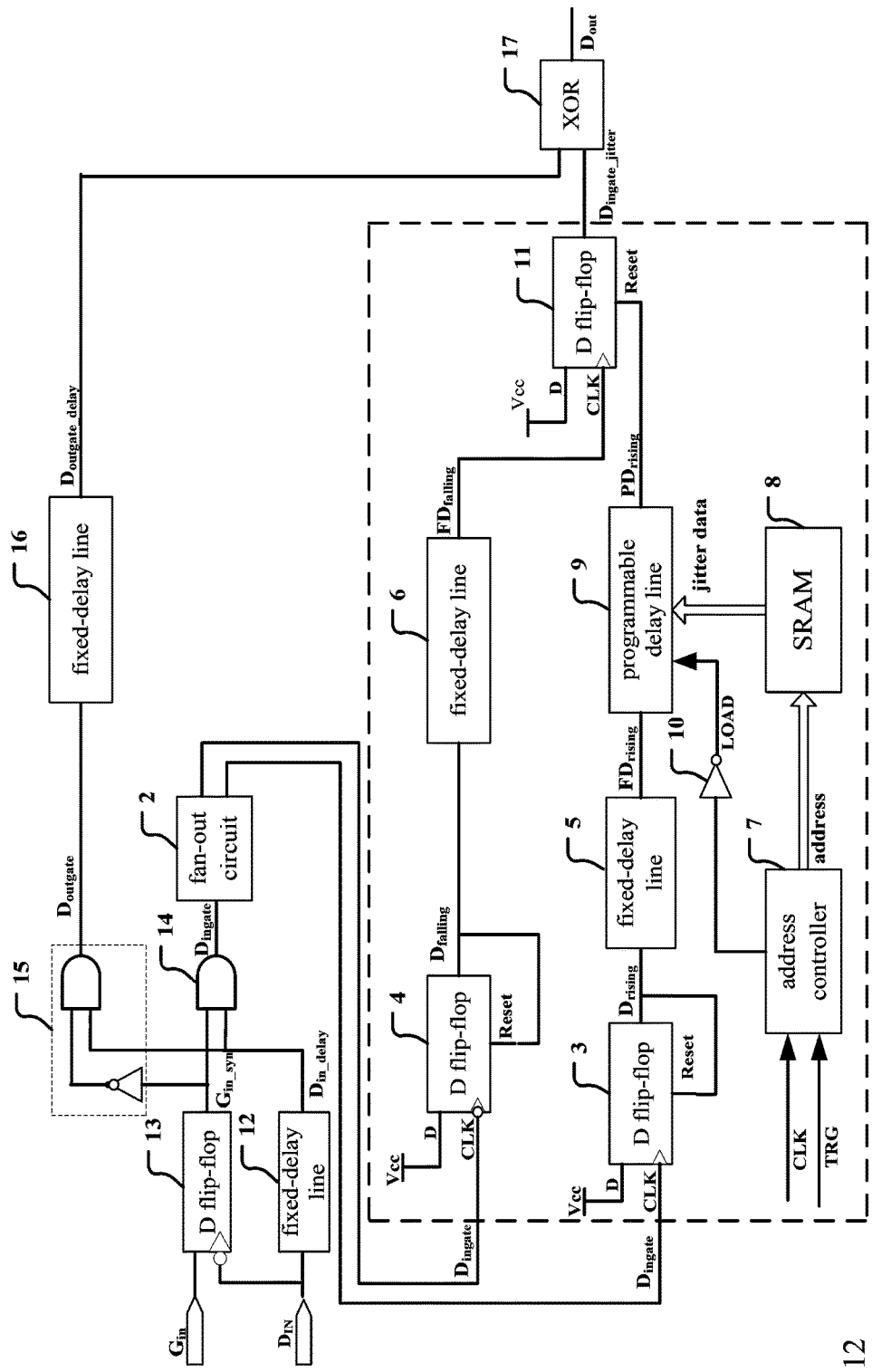
FIG. 12 is a schematic diagram of the apparatus for adding jitters to edges of a pulse sequence, which is shown in FIG. 11.

In another embodiment of the present invention, as shown in FIG. 11 and FIG. 12, except that jitters are added to the rising edges of the pulse sequence $D_{in}$, the apparatus for adding jitters to the edges of a pulse sequence is the same to the apparatus shown in FIG. 8. The elaboration of the embodiment is omitted.

While illustrative embodiments of the invention have been described above, it is, of course, understand that various modifications will be apparent to those of ordinary skill in the art. Such modifications are within the spirit and scope of the invention, which is limited and defined only by the appended claims.

What is claimed is:

1. An apparatus for adding jitters to the edges of a pulse sequence, comprising: a digital signal generator, a fan-out circuit, a first edge-pulse converter, a second edge-pulse converter, a first fixed-delay circuit, a second fixed-delay circuit, an address controller, a jitter data storage circuit, a programmable delay circuit, a phase shifter and an edge synthesis circuit, wherein:

the digital signal generator generates a pulse sequence, which edges are needed to add jitters to, and sends the pulse sequence to the fan-out circuit;

the fan-out circuit drives the pulse sequence, and sends the pulse sequence to the first edge-pulse converter and the second edge-pulse converter simultaneously;

the first edge-pulse converter converts the pulse sequence into a rising edge pulse signal by turning each rising edge of the pulse sequence into a narrow-pulse, and sends the rising edge pulse signal to the first fixed-delay circuit; the second edge-pulse converter converts the pulse sequence into a falling edge pulse signal by turning each falling edge of the pulse sequence into a narrow-pulse, and sends the falling edge pulse signal to the second fixed-delay circuit;

the first fixed-delay circuit receives the rising edge pulse signal, and delays it a fixed delay time ($T_1$), the second fixed-delay circuit receives the falling edge pulse signal, and delays it a fixed delay time ($T_2$); where if jitters are added to the rising edges, the rising edge pulse signal is sent to the programmable delay circuit after the first fixed delay, the falling edge pulse signal is sent to the edge synthesis circuit after the second fixed delay, the fixed delay time ($T_1$) is less than the fixed delay time ($T_2$); if jitters are added to the falling edges, the falling edge pulse signal is sent to the programmable delay circuit after the second fixed delay, the rising edge pulse signal is sent to the edge synthesis circuit after the first fixed delay, the fixed delay time ($T_1$) is greater than the fixed delay time ($T_2$);

the address controller generates addresses under the control of a clock signal and a trigger signal, and sends the addresses to the jitter data storage in sequence;

the jitter data storage circuit read out jitter data according to the addresses generated by the address controller, and then sends the jitter data to the programmable delay circuit in sequence; where the jitter data are delay times the phase shifter shifts the phase of the clock signal, and sends the shifted clock signal to the programmable delay circuit as a loading control signal, which ensures that each jitter data arrives at the programmable delay circuit before the arrival of the shifted clock;

the programmable delay circuit loads the jitter data under the control of the loading control signal, thus the programmable delay time ($T_3$) of the programmable delay circuit equals to the value of the loaded jitter data; when adding jitters to the rising edges, the programmable delay circuit will delay the rising edge pulse signal by programmable delay time ($T_3$), and the fixed delay time ($T_1$) plus programmable delay time ($T_3$) is less or greater than the fixed delay time ($T_2$), the rising edge pulse signal is sent to the edge synthesis circuit after the programmable delay; when adding jitters to the falling edges, the programmable delay circuit will delay the falling edge pulse signal by programmable delay time ($T_3$), and the fixed delay time ($T_2$) plus programmable delay time ($T_3$) is less or greater than the fixed time ($T_1$), the falling edge pulse signal is sent to the edge synthesis circuit after the programmable delay;

the edge synthesis circuit synthesizes a pulse sequence with jitter-added edges by converting the rising edges of the rising edge pulse signal and the falling edges of the falling edge pulse signal into rising edges and falling edges respectively in one signal.

2. An apparatus for adding jitters to the edges of a pulse sequence of claim 1, further comprising a third fixed-delay circuit, a sync circuit, a gate-in signal interception circuit, a gate-out signal interception circuit, a fourth fixed-delay circuit, a signal synthesis circuit, wherein:

the digital signal generator generates a pulse sequence, which edges is needed to adding jitters to, and sends the pulse sequence to the third fixed-delay circuit and sync circuit simultaneously;

the sync circuit receives a gate signal, and synchronizes the gate signal with the pulse sequence to obtain a synchronized gate signal;

the third fixed-delay circuit delays the pulse sequence to obtain a delayed pulse sequence, and the rising edge of the synchronized gate signal arrives before the rising edge's arrival of the delayed pulse sequence;

the gate-in signal interception circuit intercepts the delayed pulse sequence, and takes out the signal which is in the gate of the synchronized gate signal as a gate-in signal; the gate-in signal as a pulse sequence is sent to the fan-out circuit, then a pulse sequence with jitter-added edges is obtained by the edge synthesis circuit;

the gate-out signal interception circuit intercepts the delayed pulse sequence, and takes out the signal which is out of the gate of the synchronized gate signal as a gate-out signal; the gate-out signal is delayed by the fourth fixed-delay circuit, and the delayed gate-out signal is synchronized with the pulse sequence with jitter-added falling edges, i.e. they arrives at the signal synthesis circuit at the same time;

the signal synthesis circuit synthesizes a pulse sequence with part of jitter-added edges with the pulse sequence with jitter-added falling edges and the delayed gate-out signal.

\* \* \* \* \*